(12) United States Patent
Helms

(10) Patent No.: US 9,703,909 B2
(45) Date of Patent: *Jul. 11, 2017

(54) VERIFICATION ENVIRONMENTS UTILIZING HARDWARE DESCRIPTION LANGUAGES

(71) Applicant: International Business Machines Corporation, Armonk, NY (US)

(72) Inventor: Markus M. Helms, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 63 days.

This patent is subject to a terminal disclaimer.

(21) Appl. No.: 14/571,454

(22) Filed: Dec. 16, 2014

(65) Prior Publication Data
US 2016/0171141 A1    Jun. 16, 2016

(51) Int. Cl.
*G06F 17/50* (2006.01)

(52) U.S. Cl.
CPC ...... *G06F 17/5045* (2013.01); *G06F 17/5009* (2013.01); *G06F 17/5022* (2013.01); *G06F 17/5081* (2013.01)

(58) Field of Classification Search
CPC .................................................. G06F 17/5081
USPC .......................................................... 716/106
See application file for complete search history.

(56) References Cited

U.S. PATENT DOCUMENTS

| | | | |
|---|---|---|---|
| 5,870,588 A | 2/1999 | Rompaey et al. | |
| 5,946,472 A | 8/1999 | Graves et al. | |
| 6,701,489 B1 * | 3/2004 | Lam | 716/102 |
| 6,993,469 B1 | 1/2006 | Bortfeld | |
| 7,401,333 B2 | 7/2008 | Vandeweerd | |
| 8,595,680 B1 | 11/2013 | Steinberg | |
| 9,098,635 B2 | 8/2015 | Peri-Glass et al. | |
| 2003/0225560 A1 | 12/2003 | Garcia et al. | |
| 2003/0225561 A1 | 12/2003 | Garcia et al. | |
| 2003/0225565 A1 | 12/2003 | Garcia et al. | |
| 2004/0216023 A1 * | 10/2004 | Maoz et al. | 714/742 |

(Continued)

OTHER PUBLICATIONS

List of IBM Patents or Patent Applications Treated as Related, Appendix P, Filed Herewith, 2 pages.

(Continued)

*Primary Examiner* — Suchin Parihar
(74) *Attorney, Agent, or Firm* — Bryan D. Wells; Daniel R. Simek

(57) ABSTRACT

The method includes identifying a register-transfer level design description for a design. The method further includes identifying one or more tests to perform on the register-transfer level design description. The method includes generating a table of commands from the one or more tests to perform on the register-transfer level design description. The method includes generating a register-transfer level design description from the table of commands for at least one of a set of components including: a test driver for the design, a monitor for the design, and a checker for the design, wherein the register-transfer level design description assigns commands in the generated table of commands to be performed by a corresponding component in the set of components. The method includes simulating the identified one or more tests utilizing the generated register-transfer level design descriptions for at least one of the test driver, the checker, and the monitor.

12 Claims, 3 Drawing Sheets

(56) References Cited

U.S. PATENT DOCUMENTS

2007/0258300 A1* 11/2007 Kelderhouse et al. ....... 365/203
2009/0320002 A1   12/2009 Peri-Glass et al.
2013/0318486 A1* 11/2013 Sasaki .......................... 716/106
2015/0302133 A1* 10/2015 Ikram et al. .................. 716/102

OTHER PUBLICATIONS

Helms, et al., "Verification Environments Utilizing Hardware Description Languages", U.S. Appl. No. 14/919,756, filed Oct. 22, 2015.

\* cited by examiner

VERIFICATION ENVIRONMENTS UTILIZING HARDWARE DESCRIPTION LANGUAGES

BACKGROUND OF THE INVENTION

The present invention relates generally to verification environments, and more particularly to verification environments utilizing hardware description languages.

VHDL (VHSIC (Very High Speed Integrated Circuit) Hardware Description Language) is a hardware description language used in electronic design automation to describe digital and mixed-signal systems, such as field-programmable gate arrays and integrated circuits. VHDL can also be used as a general purpose parallel programming language.

VHDL is commonly used to write text models that describe a logic circuit. Such a model is processed by a synthesis program only if it is part of the logic design. A simulation program is used to test the logic design using simulation models to represent the logic circuits that interface to the design.

VHDL has constructs to handle the parallelism inherent in hardware designs, in order to directly represent operations which are common in hardware, such as an extended set of Boolean operators including NAND and NOR. VHDL also allows arrays to be indexed in either ascending or descending direction; both conventions are used in hardware.

SUMMARY

Embodiments of the present invention disclose a method for verifying environments utilizing hardware description languages. In one embodiment, in accordance with the present invention, the computer-implemented method identifying a register-transfer level design description for a design. The method further includes identifying one or more tests to perform on the register-transfer level design description for the design. The method further includes generating a table of commands from the one or more tests to perform on the register-transfer level design description for the design. The method further includes generating a register-transfer level design description from the table of commands for at least one of a set of components including: a test driver for the design, a monitor for the design, and a checker for the design, wherein the register-transfer level design description assigns commands in the generated table of commands to be performed by a corresponding component in the set of components. The method further includes simulating the identified one or more tests utilizing the generated register-transfer level design descriptions for at least one of the test driver, the checker, and the monitor.

DETAILED DESCRIPTION

Embodiments of the present invention recognize that it may be desirable to utilize smaller amounts of memory when utilizing simulation software with drivers, checkers, and monitors. If a computing device has a limited amount of storage space, it may be beneficial to not store memory that includes information related to before a program is run, after a program has run, and expected results for after a program has run.

Implementation of embodiments of the invention may take a variety of forms, and exemplary implementation details are discussed subsequently with reference to the Figures.

Figure 1:
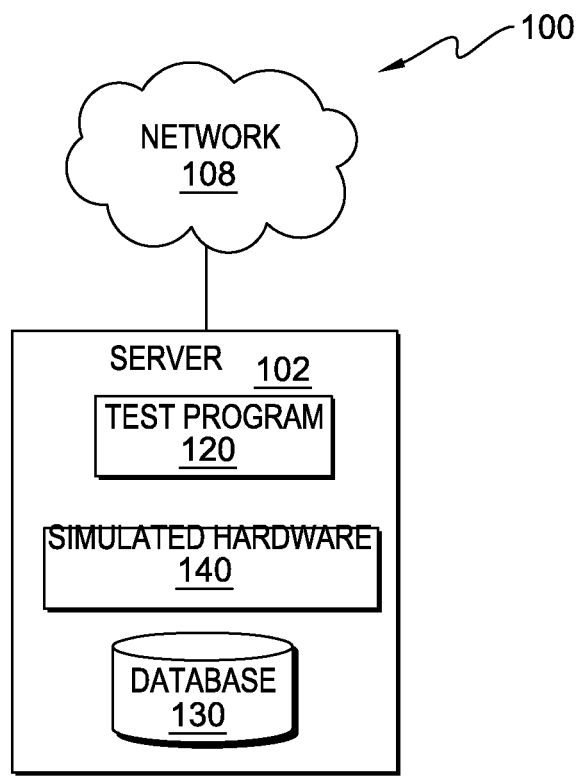
FIG. 1 is a functional block diagram illustrating a distributed data processing environment, in accordance with an embodiment of the present invention.

FIG. 1 is a functional block diagram illustrating a distributed data processing environment, generally designated 100, in accordance with one embodiment of the present invention. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes server 102, which is connected to network 108. Network 108 represents, for example, a telecommunications network, a local area network (LAN), a wide area network (WAN), such as the Internet, or a combination of the three, and includes wired, wireless, and/or fiber optic connections. Network 108 includes one or more wired and/or wireless networks that are capable of receiving and transmitting data, voice, and/or video signals, including multimedia signals that include voice, data, and video information.

In the depicted environment, server 102 is one or more of a management server, a web server, or any other electronic device or computing system capable of receiving and sending data. In other embodiments, server 102 represents a server computing system utilizing multiple computers as a server system, such as in a cloud computing environment. In another embodiment, server 102 represents a laptop computer, a tablet computer, a netbook computer, a personal computer (PC), a desktop computer, a personal digital assistant (PDA), a smart phone, or any programmable electronic device capable of communicating with network 108. In another embodiment, server 102 represents a computing system utilizing clustered computers and components to act as a single pool of seamless resources. Server 102 includes test program 120, simulated hardware 140, and database 130. Server 102 may include components as depicted and described in further detail with respect to FIG. 4, in accordance with embodiments of the present invention.

In the depicted embodiment, database 130 resides on server 102. In another embodiment, database 130 may reside elsewhere in distributed data processing environment 100, such as independently as a standalone database that is capable of communicating with server 102 via network 108. A database is an organized collection of data. Database 130 is implemented with any type of storage device capable of storing data that is accessed and utilized by server 102, such as a database server, a hard disk drive, or a flash memory. In other embodiments, database 130 represents multiple storage devices within server 102. Database 130 stores information, such as testcase files (e.g., programs and/or files created by a user or computer to test simulated hardware, such as simulated hardware 140), expected results, and/or command sequences. Database 130 may include components as depicted and described in further detail with respect to FIG. 4, in accordance with embodiments of the present invention.

In depicted distributed data processing environment 100, test program 120 resides on server 102 and verifies components of a computing device (e.g., device under test (DUT), driver, checker, and/or monitor) in very high speed integrated circuit (VHSIC) hardware description language (VHDL), Verilog, or other hardware description languages known in the art. In various embodiments, test program 120 conducts tests on simulated hardware (e.g., simulated hardware 140) to determine if the simulated hardware includes bugs. In some embodiments, test program 120 may determine the location of the bug or what caused the error in the hardware. For the purposes of this application, a register is a mean of a logic resource that can store values (e.g., a latch, a static random-access memory, an array, or a memory) and/or can trigger logic actions (e.g., start an encryption). The logic resource has a fixed width (e.g., 64 bits) and can be accessed by software or firmware via an address. Software or firmware can read or write a registered resource that is mapped to an address. The DUT provides a set of registers, such as source-data-register (e.g., data input into the design), control registers (e.g., a command to start a hashing, encryption, compression, etc.), or a result-register (e.g., provides status information, such as done or processed number of bytes) that can be read by software and/or firmware.

In an embodiment, test program 120 may be located on another computing device (e.g., a server, a personal computing device, etc.) and communicates with the simulated hardware and database via network 108. Test program 120 is depicted and described in further detail with respect to FIGS. 2 and 3.

In depicted distributed data processing environment 100, simulated hardware 140 is located on server 102 and can communicate with other computing devices via network 108. Simulated hardware 140 is a software program designed to imitate hardware before the hardware is actually created. For example, simulated hardware 140 can be described as a register-transfer level (RTL). A RTL can be described as a design abstraction, which models a synchronous digital circuit in terms of the flow of digital signals between hardware register and the logical operation performed on those signals. Test program 120 can run tests on simulated hardware 140 to determine if simulated hardware 140 is working properly or if simulated hardware 140 includes any design flaws that need to be addressed. In various embodiments, simulated hardware 140 may be put into specialized accelerator hardware or field programmable gate arrays.

Figure 2:
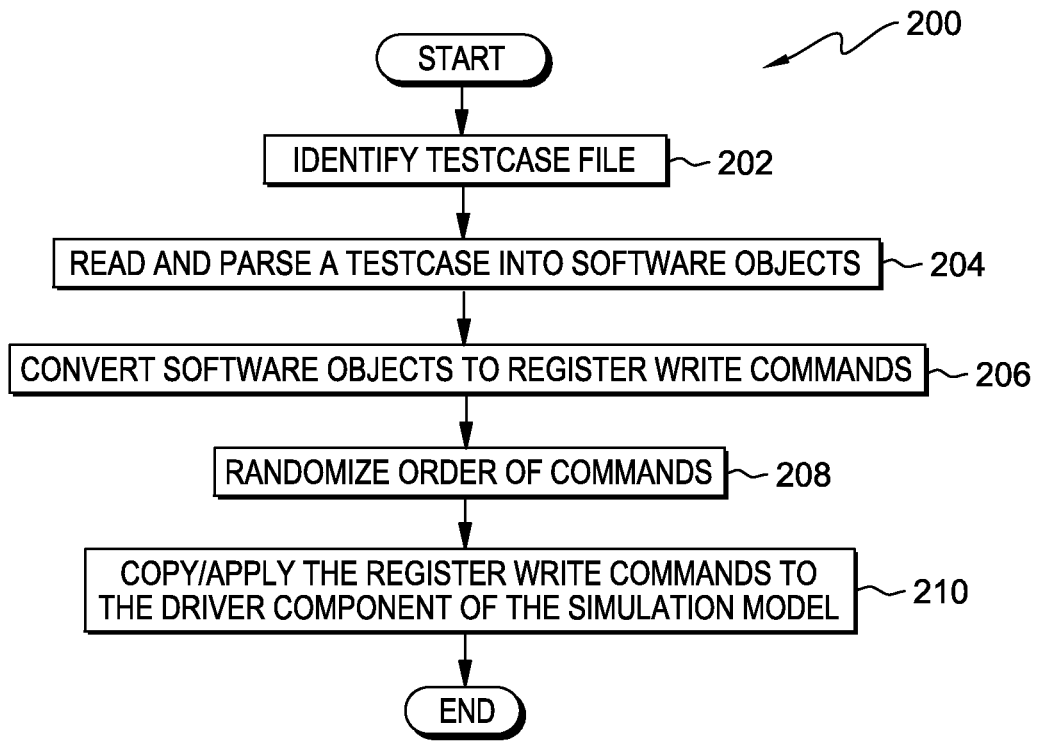
FIG. 2 is a flowchart depicting operational steps of a program for converting testcase files into randomized write commands within the distributed data processing environment of FIG. 1, in accordance with an embodiment of the present invention.

FIG. 2 is a flowchart depicting operational steps of program 200, which is a function of test program 120, in accordance with an embodiment of the present invention. Program 200 operates on server 102 and converts testcase files into a table of randomized write commands. In a preferred embodiment, program 200 creates the entire table of commands during one implementation. In an embodiment, program 200 begins the operational steps of FIG. 2 after input from a user indicates that all testcase files have been loaded into database 130. In another embodiment, program 200 begins the operational steps of FIG. 2 after the last testcase file has been generated by a user, an automated program, or any other form known in the art. In yet another embodiment, program 200 may receive input from a user indicating program 200 should begin the operational steps of FIG. 2.

Program 200 identifies a testcase file (step 202). In various embodiments, program 200 identifies one or more testcase files located in a database (e.g., database 130) located either on server 102 or another computing device (not depicted) via network 108. In an example, a testcase file is a program and/or file that is generated by a computer or user to test simulated hardware (e.g., simulated hardware 140) to determine if the simulated hardware is functioning properly before creating hardware. Further examples of testcases may include information about control setup and input buffer. The testcase forms a sequence of multiple setup commands, one status read command, and an optional cyclical redundancy check (CRC) command. In various examples, program 200 may identify as little as one testcase file or as many as fifty testcase files for a particular simulated hardware program (e.g., simulated hardware 140). In various embodiments, testcase files may be designed to run in program 300 at the same time to test for multiple threats to the simulated hardware. In some examples, there may be 2, 4, 8, etc. testcase files designed to run at the same time in program 300. In various embodiments, program 200 may randomly identify testcase files.

Program 200 reads and parses a testcase into software objects (step 204). In various embodiments, program 200 reads and parses identified testcases from step 202 into software objects. In an example of parsing, program 200 may use methods known in the art to parse the testcase files, such as a software component that takes input data and builds a data structure. Often, this includes some kind of parse tree, abstract syntax tree, or other hierarchical structure giving a structural representation of the input and checking for correct syntax in the process. Parsing may be preceded or followed by other steps, or these may be combined into a single step. Parsing is often preceded by a separate lexical analyzer, which creates tokens from the sequence of input characters; alternatively, these can be combined in scanner-less parsing. In an example of software objects, an object can be a variable, a data structure, or a function. In class-based object-oriented programming paradigm, "object" refers to a particular instance of a class where the object can be a combination of variables, functions, and data structures. In relational database management, an object can be a table or column, or an association between data and a database entity, such as relating a person's age to a specific person.

Program 200 converts software objects to register write commands (step 206). In an embodiment, program 200 converts the software objects from the identified test case parsed in step 204 into write commands. In an example, program 200 converts software objects from one type of computer language into another type of computer language, which can be utilized by program 300. In various embodiment, program 200 may convert multiple commands for each testcase file into register write commands that can be utilized by program 300. An example of a command may be a directive to a computer program acting as an interpreter of some kind in order to perform a specific task. In an example, write commands are used by program 300 to perform tests on simulated hardware 140, which correspond to the testcases that were previously generated.

Program 200 randomizes the order of commands (step 208). In an embodiment, program 200 randomizes the order of commands from step 206 and creates a table of the random commands for each testcase. In various embodiments, each table may comprise multiple sequences of commands, which may correspond to a specific testcase file. In said various embodiments, program 200 can add multiple sequences to create a master table for all tests to be conducted on hardware simulations (e.g., simulated hardware 140). In some embodiments, program 200 randomizes the commands to achieve a higher variety in challenging the device under test (DUT).

Program 200 copies/applies the register write commands to the driver component of the simulation-model (step 210). In an embodiment, program 200 copies the generated, randomized list of commands and applies the commands to the driver of the simulation model, also known as the simulated hardware (e.g., simulated hardware 140). In various embodiments, copying/applying the register write commands to the driver component of the simulated hardware is only done once. In an example, a driver component defines input into hardware or simulated hardware. In this example, the driver component converts commands from the table of commands into a hardware or simulated hardware interface driving the inputs into the DUT. In an example, each sequence and table of commands is applied to simulated hardware 140 by program 200.

Figure 3:
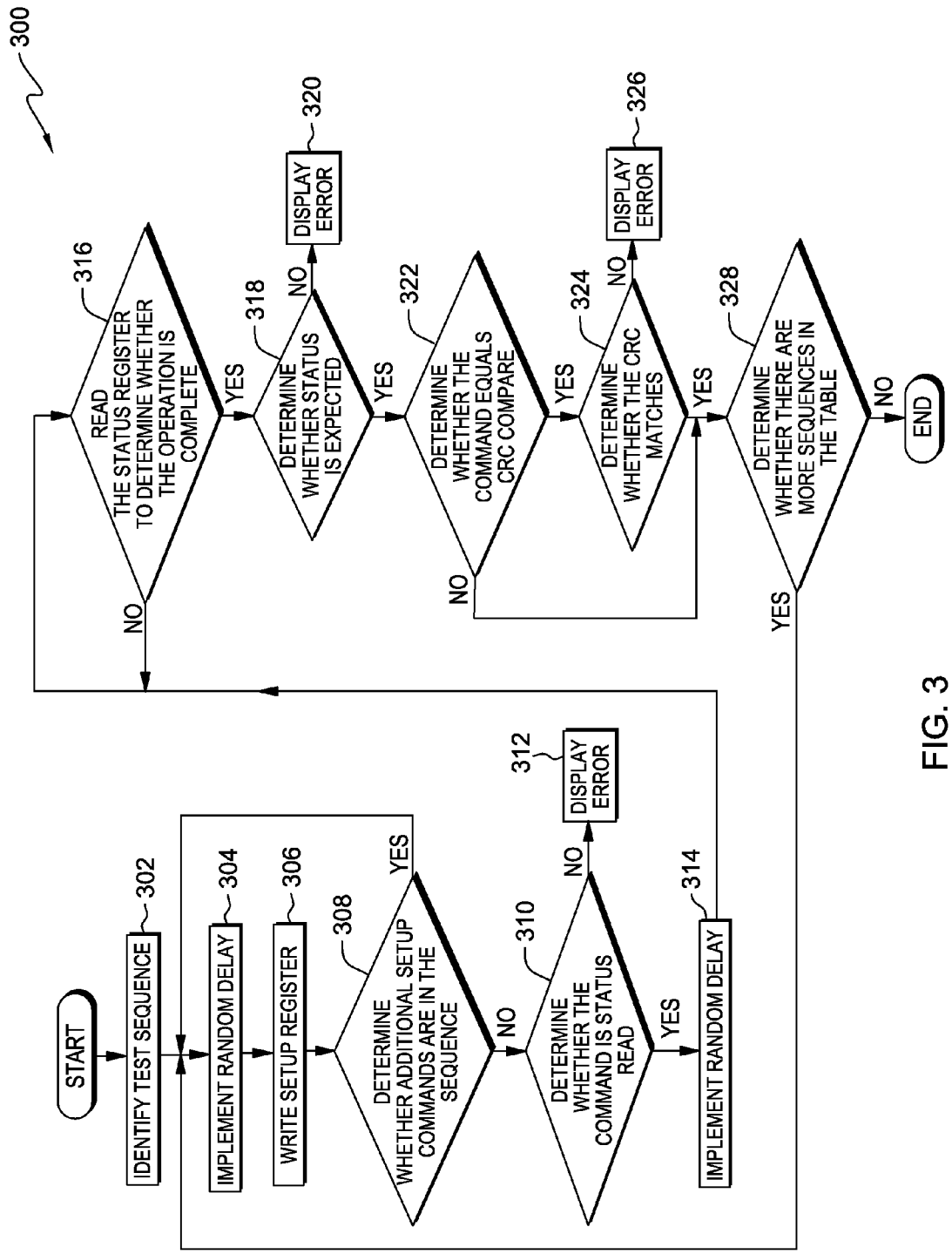
FIG. 3 is a flowchart depicting operational steps of a program for testing simulated hardware with the table of randomized write commands generated in FIG. 2 within the distributed data processing environment of FIG. 1, in accordance with an embodiment of the present invention.

FIG. 3 is a flowchart depicting operational steps of program 300, which is a function of test program 120, in accordance with an embodiment of the present invention. Program 300 operates on server 102 and tests simulated hardware with the table of randomized write commands generated in FIG. 2. In various embodiments, program 300 begins the operational steps of program 300 via a user command automatically after the completion of a table of commands is created (e.g., in step 208 of program 200) or at a preset time.

Program 300 identifies a test sequence (step 302). In an embodiment, program 300 identifies a test sequence from the table of commands generated in step 208 of FIG. 2. In one embodiment, a sequence of commands, also known as a test sequence, is a set of commands for a testcase. There may be multiple sequences of commands which correspond to multiple testcases that can be used to test the simulated hardware. Multiple sequences of commands make up a table of commands. In an embodiment, program 300 identifies a single test sequence from the one or more test sequences located in the table of commands. In an example, program 300 randomly selects a test sequence from a table that includes 15 test sequences. In another example, program 300 selects a specific test sequence that is to be run at the same time as another test sequence.

Program 300 implements a random delay (step 304). In various embodiments, program 300 implements random delays before a command is run to challenge the simulated hardware (e.g., simulated hardware 140). In an example, program 300 utilizes a pseudorandom number generator to create a variety of delays, such as 0 to 20 cycles, where one cycle is equivalent to 180 picoseconds. In an embodiment, program 300 implements a random delay to test the simulated hardware to verify buffering or late state transition. In another example, the random delay implemented by program 300 creates an implementation in which threats arrive at different times, and the simulated software must decide which command to implement first or if the simulated hardware is faster or slower than the information it is receiving. In various examples, program 300 challenges the device under test with a delay to achieve fast vs. slow input rates as opposed to the DUT processing rate, which tests typical, well-known sources of bugs in underrun/overrun corner cases.

Program 300 writes setup register (step 306). In an embodiment, program 300 identifies a command from the one or more commands in the identified sequence of commands and implements the command on the simulated hardware (e.g., simulated hardware 140). In an example of writing setup register, program 300 drives the inputs of the design, such as sending the command to the simulated hardware interface which receives the command. The command will contain information that the simulated hardware is to perform.

Program 300 determines whether additional setup commands are in the sequence (decision 308). In an embodiment, program 300 determines if the identified test sequence includes additional commands (identified in step 302). If program 300 determines that additional setup commands are in the sequence (yes branch, decision 308), then program 300 returns to step 304.

If program 300 determines additional setup commands are not in the sequence (e.g., program 300 has reached the last or second to last command in the sequence) (no branch, decision 308), then program 300 determines whether the command has a status of read (decision 310). In an embodiment, program 300 determines the command status after receiving the status from the simulated hardware (e.g., simulated hardware 140). In various examples, program 300 may receive a status indicating that whether the simulated hardware has completed the command or an amount of data that has been read.

If program 300 determines that the command status is not read (no branch, decision 310), then program 300 displays an error (step 312). In an example, program 300 receives data indicating that simulated hardware 140 has read only half of the data that simulated hardware 140 should have. In another example, program 300 receives an error message from simulated hardware 140. In various embodiments in which the command status is not read, program 300 may display an error message or indicate that a bug is in the testcase software. In some examples, program 300 displays where the error occurred. In another example, program 300 displays the results of the status which indicate an error.

If program 300 determines that the command status is read (yes branch, decision 310), then program 300 implements a random delay (step 314). In various embodiments, program 300 implements random delays before a command is run to challenge the simulated hardware (e.g., simulated hardware 140). In an example, program 300 utilizes a pseudorandom number generator to create a variety of delays, such as 0 to 20 cycles, where one cycle is equivalent to 180 picoseconds. In an embodiment, program 300 implements a random delay to test the simulated hardware to verify buffering or late state transition. In another example, the random delay implemented by program 300 creates an implementation in which threats arrive at different times, and the simulated software must decide which command to implement first or if the simulated hardware is faster or slower than the information it is receiving.

Program 300 reads the status register to determine whether the operation is complete (decision 316). Program 300 reads the status register on the simulated hardware (e.g., simulated hardware 140) to determine the status of operation created by the command. In an example, program 300 reads the status register to identify what a done bit indicator reads. If program 300 determines that the operation is not complete (no branch, decision 316), then program 300 begins decision 316 again. In an example, program 300 identifies the status by checking the done indicator. In an example in which the done indicator bit is set to 0 (not complete), program 300 repeats the command until the done bit indicated is set to 1 (complete).

If program 300 determines that the status of the operation is complete (yes branch, decision 316), then program 300 determines if the status is expected (decision 318). In various embodiments, program 300 determines if the status is expected based on the results, such as the amount of data created or read, exception or no exception reporting, etc. In an example, program 300 has an expected amount of data that should be created, and program 300 compares the created amount of data to the expected amount of data. In one embodiment, a monitor or a checker is used to determine the results. In this embodiment, a monitor reads the output signals of hardware, or simulated hardware, and points to the bit that is wrong. A checker works with the monitor to identify violations of rules. The checker can compare expected results, such as an amount of data, versus the actual results after a test. In some embodiments, checkers and monitors may be combined.

If program 300 determines that the status is not expected (no branch, decisions 318), then program 300 displays an error (step 320). In an embodiment, program 300 receives data indicating that status is not expected because the simulated hardware (e.g., simulated hardware 140) has created only half of the data that simulated hardware 140 should have. In an example, simulation hardware is used for encryption and only encrypts a portion of the information. In another example, program 300 receives an error message from simulated hardware 140. In various embodiments in which the status is not expected, program 300 may display an error message or indicate that there is a bug in the simulated hardware (e.g., simulations hardware 140). In some examples, program 300 displays where the error occurred. In another example, program 300 displays the results of the status which indicate there is an error.

If program 300 determines that the status is expected (yes branch, decision 318), then program 300 determines whether the command equals the cyclical redundancy check (CRC) compare (decision 322). In some embodiments, results may or may not be produced in the main memory. In some embodiments, results are not produced in the main memory, and the results may be only in the status registry. If the command does not equal the CRC compare (no branch, decision 322), then program 300 proceeds to decision 328.

If the command equals the CRC compare (yes branch, decision 322), then program 300 determines if the CRC matches (decision 324). In an embodiment, program 300 checks all the bits stored in the main memory to determine if the CRC matches. For example, the result data created by simulated hardware 140 is generating a CRC overall result data. The CRC overall result data is compared to a pre-calculated expected CRC. In an embodiment, the checker accesses a database (e.g., database 130) to determine the expected outcome of the testcase command and then compares the expected outcome to the actual outcome.

If the CRC does not match (no branch, decision 324), then program 300 displays an error (step 326). In an embodiment, program 300 receives data indicating that the CRC does not match the pre-calculated CRC (e.g., all the bites are not stored as expected). In various embodiments in which the CRC does not match, program 300 may display an error message or indicate that there is a bug in the simulated hardware (e.g., simulated hardware 140). In some examples, program 300 displays where the error occurred. In another example, program 300 displays the results of the comparison between the expected CRC and the actual CRC which indicates an error.

If the CRC does match (yes branch, decision 324), then program 300 determines whether the table includes more sequences (decision 328). In an embodiment, program 300 determines whether the table (generated by program 200) includes more sequences that program 300 has not yet tested. For example, the table may include 15 sequences and program 300 determines a number of sequences that have been processed. If program 300 determines that there are no more sequences in the table (no branch, decision 328), then program 300 ends the operational steps of FIG. 3. If program 300 determines that the table does include more sequences (yes branch, decision 328), then program 300 identifies a test sequence that has not been processed and proceeds to step 304.

Figure 4:
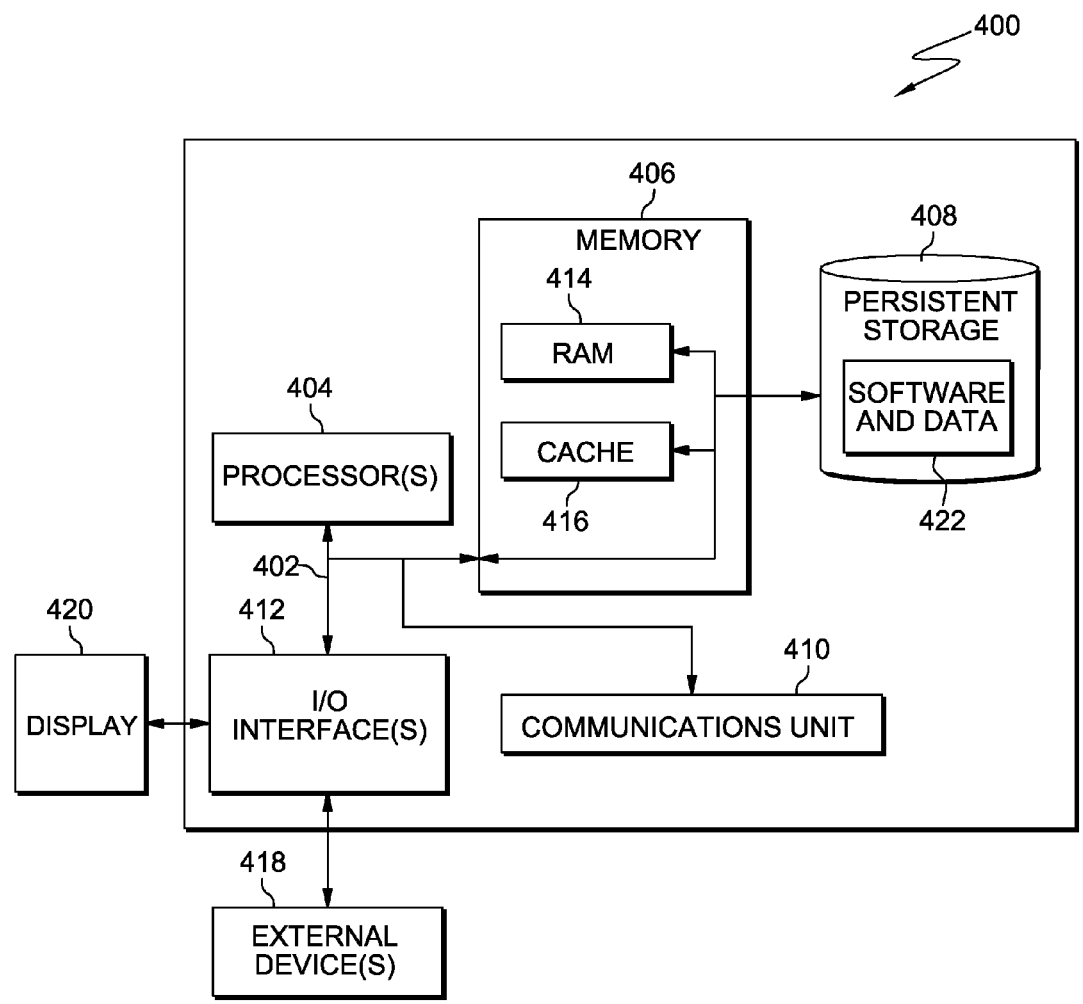
FIG. 4 depicts a block diagram of components of a server, and client devices of FIG. 1, in accordance with an embodiment of the present invention.

FIG. 4 depicts a block diagram of components of computer 400, which is representative of server 102, in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Computer 400 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications, and network processors, etc.), system memory, peripheral devices, and any other hardware components within a system. For example, communications fabric 402 can be implemented with one or more buses.

Memory 406 and persistent storage 408 are computer readable storage media. In this embodiment, memory 406 includes random access memory (RAM) 414 and cache memory 416. In general, memory 406 can include any suitable volatile or non-volatile computer readable storage media. Software and data 422 are stored in persistent storage 408 for access and/or execution by processor(s) 404 via one or more memories of memory 406. With respect to server 102, software and data 422 represents test program 120 and database 130.

In this embodiment, persistent storage 408 includes a magnetic hard disk drive. Alternatively, or in addition to a magnetic hard disk drive, persistent storage 408 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links. Software and data 422 may be downloaded to persistent storage 408 through communications unit 410.

I/O interface(s) 412 allows for input and output of data with other devices that may be connected to computer 400. For example, I/O interface(s) 412 may provide a connection to external device(s) 418 such as a keyboard, a keypad, a touch screen, and/or some other suitable input device. External device(s) 418 can also include portable computer readable storage media such as, for example, thumb drives, portable optical or magnetic disks, and memory cards. Software and data 422 can be stored on such portable computer readable storage media and can be loaded onto persistent storage 408 via I/O interface(s) 412. I/O interface(s) 412 also connect to a display 420.

Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer program product for verifying environments utilizing hardware description languages, the computer program product comprising:
   one or more computer readable storage devices and program instructions stored on the one or more computer readable storage devices, the program instructions comprising:
   program instructions to identify a register-transfer level design description of a simulated device under test in a first computer language, wherein the first computer language is a hardware description language;
   program instructions to identify one or more tests to perform on the register-transfer level design description of the simulated device under test;
   program instructions to parse the one or more tests into one or more software objects, wherein the one or more software objects are described in a second computer language;
   program instructions to convert the software objects into one or more commands, wherein the one or more commands are written in the first computer language;
   program instructions to, in a one-time initialization, (i) generate a table of commands from the one or more commands to execute on the register-transfer level design description of the simulated device under test and (ii) copy the table of commands to a driver for the simulated device under test, wherein the driver is simulated in the first computer language; and
   program instructions to input, via the driver, one or more commands in the table of commands into an interface of the register-transfer level design description of the simulated device under test.

2. The computer program product of claim 1, wherein the one or more commands to execute on the register-transfer level description of the simulated device under test comprises write/read blocks of associated write commands for control registers in the register-transfer level description of the simulated device under test and read commands for status registers in the register-transfer level description of the simulated device under test.

3. The computer program product of claim 1, wherein program instructions to generate a table of commands from the one or more commands to execute on the register-transfer level description of the simulated device under test comprises program instructions to:
   randomize an order of one or more write/read command blocks in the one or more commands to execute on the register-transfer level description of the simulated device under test.

4. The computer program product of claim 3, further comprising program instructions to:
   generate random delays between subsequent write/read command blocks.

5. The computer program product of claim 1, further comprising program instructions to:
   in response to receiving an error during a test of the simulated device under test, execute program instructions to generate a report that details where the received error occurred.

6. The computer program product of claim 1, wherein is generated in a very high speed integrated circuit hardware description language.

7. A computer system for verifying environments utilizing hardware description languages, the computer system comprising:
   one or more computer processors;
   one or more computer readable storage devices;
   program instructions stored on the computer readable storage devices for execution by at least one of the one or more computer processors, the program instructions comprising:
   program instructions to identify a register-transfer level design description of a simulated device under test in a first computer language, wherein the first computer language is a hardware description language;
   program instructions to identify one or more tests to perform on the register-transfer level design description of the simulated device under test;
   program instructions to parse the one or more tests into one or more software objects, wherein the one or more software objects are described in a second computer language;
   program instructions to convert the software objects into one or more commands, wherein the one or more commands are written in the first computer language;
   program instructions to, in a one-time initialization, (i) generate a table of commands from the one or more commands to execute on the register-transfer level design description of the simulated device under test and (ii) copy the table of commands to a driver for the simulated device under test, wherein the driver is simulated in the first computer language; and
   program instructions to input, via the driver, one or more commands in the table of commands into an interface of the register-transfer level design description of the simulated device under test.

8. The computer system of claim 7, wherein the one or more commands to execute on the register-transfer level description of the simulated device under test comprises write/read blocks of associated write commands for control registers in the register-transfer level description of the simulated device under test and read commands for status registers in the register-transfer level description of the simulated device under test.

9. The computer system of claim 7, wherein program instructions to generate a table of commands from the one or more commands to execute on the register-transfer level description of the simulated device under test comprises program instructions to:

randomize an order of one or more write/read command blocks in the one or more commands to execute on the register-transfer level description of the simulated device under test.

10. The computer system of claim 9, further comprising program instructions to:

generate random delays between subsequent write/read command blocks.

11. The computer system of claim 7, further comprising program instructions to:

in response to receiving an error during a test of the simulated device under test, execute program instructions to generate a report that details where the received error occurred.

12. The computer system of claim 7, wherein the table of commands is generated in a very high speed integrated circuit hardware description language.

\* \* \* \* \*